(12) United States Patent
Jain et al.

(10) Patent No.: US 7,345,355 B2
(45) Date of Patent: Mar. 18, 2008

(54) COMPLEMENTARY JUNCTION-NARROWING IMPLANTS FOR ULTRA-SHALLOW JUNCTIONS

(75) Inventors: Amitabh Jain, Allen, TX (US); Stephanie W. Butler, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 139 days.

(21) Appl. No.: 10/942,607

(22) Filed: Sep. 15, 2004

(65) Prior Publication Data

US 2005/0042848 A1    Feb. 24, 2005

Related U.S. Application Data

(62) Division of application No. 10/393,749, filed on Mar. 21, 2003, now Pat. No. 6,808,997.

(51) Int. Cl.
*H01L 29/00* (2006.01)
*H01L 31/0288* (2006.01)

(52) U.S. Cl. ............... 257/607; 257/463; 257/465; 257/545; 257/548; 438/305; 438/390; 438/395; 438/252

(58) Field of Classification Search ......... 257/264, 257/336, 344, 408, 543, 548–550, 607, 101–102, 257/285, 450, 463, 465, 545, 927, 599, 596–597, 257/654, E29.012, E29.013, E29.11, E29.266; 438/305, 390, 395, 252
See application file for complete search history.

(56) References Cited

U.S. PATENT DOCUMENTS

| | | | |
|---|---|---|---|
| 5,767,574 A | 6/1998 | Kim et al. | 438/528 |
| 5,793,090 A | 8/1998 | Gardner et al. | 257/408 |
| 5,825,066 A | 10/1998 | Buynoski | 257/345 |
| 5,972,783 A * | 10/1999 | Arai et al. | 438/513 |
| 6,069,062 A | 5/2000 | Downey | 438/528 |
| 6,087,247 A | 7/2000 | Downey | 438/530 |
| 6,180,476 B1 | 1/2001 | Yu | 438/305 |
| 6,255,173 B1 | 7/2001 | Jang | 438/279 |
| 6,265,255 B1 | 7/2001 | Hsien | 438/199 |
| 6,355,543 B1 | 3/2002 | Yu | 438/535 |
| 6,358,823 B1 | 3/2002 | Krueger et al. | 438/515 |
| 6,534,373 B1 * | 3/2003 | Yu | 438/372 |
| 2001/0041432 A1 * | 11/2001 | Lee | 438/530 |
| 2003/0179343 A1 * | 9/2003 | Marechal et al. | 351/159 |

OTHER PUBLICATIONS

"Counterdoped Very Shallow p+/n Junctions Obtained by B and Sb Implantation and Codiffusion in Si", Solmi Sandro, Journal of Applied Physics, American Institute of Physics, New York, vol. 83, No. 3, pp. 1742-1747.

* cited by examiner

*Primary Examiner*—Zandra V. Smith
*Assistant Examiner*—Thanh Y. Tran
(74) *Attorney, Agent, or Firm*—Yingsheng Tung; Wade James Brady, III; Frederick J. Telecky, Jr.

(57) ABSTRACT

Methods are disclosed for forming ultra shallow junctions in semiconductor substrates using multiple ion implantation steps. The ion implantation steps include implantation of at least one electronically-active dopant as well as the implantation of at least two species effective at limiting junction broadening by channeling during dopant implantation and/or by thermal diffusion. Following dopant implantation, the electronically-active dopant is activated by thermal processing.

4 Claims, 2 Drawing Sheets

COMPLEMENTARY JUNCTION-NARROWING IMPLANTS FOR ULTRA-SHALLOW JUNCTIONS

CROSS-REFERENCE TO RELATED APPLICATIONS

This is a divisional application of application Ser. No. 10/393,749 filed Mar. 21, 2003, now U.S. Pat. No. 6,808,997.

STATEMENT REGARDING FEDERALLY SPONSORED RESEARCH OR DEVELOPMENT

Not Applicable.

BACKGROUND OF THE INVENTION

1. Technical Field of the Invention

The present invention generally relates to methods for forming ultra-shallow junctions in semiconductor wafers by ion implantation of dopants and, more particularly, to methods for controlling junction depth and narrowing dopant concentration profile by minimizing dopant channeling during implantation and retarding dopant diffusion during subsequent thermal annealing.

2. Description of Related Art

The semiconductor technology central to the modem integrated circuit has been developing for over a century. The special properties of the semiconductor selenium were first observed and recognized in the late nineteenth century. The first transistor design was proposed during the 1930s. However, a functional point contact transistor was not constructed until the late 1940s. For the next ten years, the field of electronics was dominated by the use of discrete circuit components—e.g., transistors, resistors and capacitors—in circuit design. The integrated circuit, which employs a plurality of circuit components in a single monolithic semiconductor substrate rather than using discrete components, was first developed in the late 1950s by inventor Jack Kilby at Texas Instruments, Inc.

Since the late 1950s, integrated circuit technology has evolved rapidly and has revolutionized virtually every industry and capacity in which electronics are used. The proliferation of electronics in general, and integrated circuits in particular, has resulted in large part from the ability to increase circuit functionality while simultaneously reducing device cost and size. A principal catalyst for these improvements has been a number of advances in semiconductor processing technologies, the various techniques used to construct integrated circuits on the semiconductor substrate. Improved materials, equipment and processes have allowed increasingly complex circuits possessing improved speed, requiring less power, and occupying less space.

Integrated circuits are typically constructed at the surface of crystalline silicon wafers, although other semiconductor materials such as gallium arsenide and germanium are also used. Individual circuit components are formed in and on the wafer surface. The electrical interconnectivity between circuit elements is then established above the semiconductor substrate using alternating layers of appropriately patterned conductors and insulators. The circuit components and their interconnections are formed using a series of well-known processing steps including photolithography, thin film deposition, selective etching, ion implantation and thermal processing.

For the last two decades, metal-oxide semiconductor (MOS) technology has occupied a central role in integrated circuit design. The heart of the MOS integrated circuit is the metal-oxide semiconductor field-effect transistor (MOSFET), which serves as a high-speed switch. In the MOSFET, the conductivity through a thin channel located between a source electrode and a drain electrode is controlled by a voltage applied to a gate electrode located in proximity to the channel. Ideally, a MOSFET exhibits high drive current and low internal impedance in the "on" state and exhibits high internal impedance and low current leakage in the "off" state. MOSFETs offer remarkable noise immunity, operability over wide voltage ranges, and a number of other desirable properties that make them ideal for logic circuitry.

MOSFETs can be categorized as either n-type or p-type, depending on the manner in which the source electrode, drain electrode and channel are doped. In an n-type MOSFET, the source and drain of the transistor are doped with an n-type dopant that is electron rich relative to silicon—e.g., arsenic and phosphorous—while the channel is doped with a p-type dopant that is electron deficient relative to silicon—e.g., boron and indium. The insertion of an n-type dopant in the semiconductor lattice results in an additional electron in the conduction band of the semiconductor. Because conduction-band electrons are majority charge carriers in an n-type MOSFET, current conduction is primarily via conduction-band electrons. Consequently, conduction through the p-doped channel of a n-type MOSFET occurs only when the potential applied to the gate electrode results in a substantial concentration of conduction-band electrons in the channel.

Conversely, in an p-type MOSFET, the source and drain electrodes are doped with a p-type dopant and the channel is doped with an n-type dopant. The insertion of a p-type dopant in the semiconductor lattice results in a valence-band "hole"—i.e., a positively-charged electron deficiency in the valence band of the semiconductor—that can move under the application of an external electric field. Because conduction-band electrons are minority charge carriers and valence-band holes are majority charge carriers in a p-type MOSFET, current conduction is primarily via valence-band holes. Consequently, conduction through the n-doped channel of a p-type MOSFET occurs only when the potential applied to the gate electrode results in a substantial concentration of valence-band holes in the channel.

Current integrated circuit designs using ultra large scale integration (ULSI) frequently utilize as many as several hundred million circuit elements. The increasing packing density in these circuits generates numerous challenges to the semiconductor manufacturing process: the dimensions of each circuit element must shrink in each product generation without degrading the characteristics and the operations of the integrated circuit. The commercial popularity of the MOSFET in circuit design is due partly to its scalability. Scaling of these devices is advantageous for several reasons. First, it increases the device packing density, thereby reducing the size of the integrated circuit. Second, scaling to smaller dimensions improves the frequency response of the transistor, whose signal propagation time is proportional to the inverse of the length of the channel. Third, decreasing the channel length and gate oxide thickness increases transistor transconductance, which increases the current drive of the transistor.

As MOSFET dimensions continue to shrink, further scaling becomes increasingly difficult, in part because of so-called "short-channel effects." In devices with long channel lengths, the gate voltage is principally responsible for depleting majority charge carriers and attracting minority charge carriers in the channel, a process known as inversion. In very short channel devices, in contrast, the electric fields generated by the source and drain can contribute to the inversion in the channel. These short-channel effects decrease the threshold gate voltage ($V_t$) required for inversion and for conduction through the channel. In such cases, $V_t$ is not constant and instead decreases as the drain and source fields increase, a phenomenon known as $V_t$ rolloff. This effect is particularly prominent when high drain voltages are employed, leading to drain-induced barrier lowering (DIBL). DIBL is the effect a drain voltage has on the output conductance and measured $V_t$. It is observed as a variation of the measured threshold voltage with reduced gate length. In the case of very short channels and high drain voltages, the inversion region can extend across the channel without regard to the gate voltage. In such cases, referred to as "punchthrough," the transistor is locked in the "on" state. Thus, as MOSFET dimensions shrink, "short channel effects" such as junction punchthrough, the leakage, and the contact resistance, degrade transistor performance and reliability.

The control of "short-channel effects" in MOSFETs is one of the biggest challenges in scaling to sub-0.1 micron dimensions. Because short-channel effects occur in MOSFETs when only the gate length is reduced without properly scaling the other MOSFET dimensions, these undesirable effects can be mitigated by also scaling the source and drain electrodes. This is accomplished by employing ultra-shallow extensions to the source and drain region that are partially disposed underneath the gate electrode. Simply put, as the lateral dimensions of the MOSFET channel are scaled down to 100 nm and below, the source/drain (S/D) extension junction depth must be proportionately reduced to below 30 nm in order to suppress short-channel effects. Furthermore, the sheet resistance of the S/D extension regions must be decreased so that they do not add significant resistance to the channel resistance. This means that ever higher active dopant concentrations must be achieved in the ultra-shallow S/D extension regions.

The Semiconductor Industry Association (SIA) has developed the National Technology Roadmap for Semiconductors (NTRS), a roadmap for the next several generations of integrated circuit devices. According to the 1997 SIA NTRS, as device geometries shrink from 0.25 micron (μm) to 0.1 μm, the junction depth will need to decrease from 750 nanometers (nm) to 30 nm. At the same time, the dopant concentration in the junction will need to increase by approximately a factor of five to maintain acceptable sheet resistance. Consequently, much research has been directed towards establishing ultra-shallow S/D extensions, also known as ultra-shallow junctions, with high dopant concentrations.

Unfortunately, a variety of factors render the formation of ultra-shallow junctions in semiconductor substrates difficult. In particular, dopant channeling during ion implantation processes and dopant diffusion during thermal activation processes tend to broaden the junctions. Despite these difficulties associated with forming ultra-shallow junctions in semiconductor substrates, such junctions are a necessary component of future MOSFET designs. What is needed is a method for forming ultra-shallow junctions in MOSFETs that overcomes the effects of dopant channeling during the ion implantation and dopant diffusion during thermal activation and thereby offers resistance to short-channel effects in next generation MOSFETs and other integrated circuit components.

BRIEF SUMMARY OF THE PREFERRED EMBODIMENTS

Some of the preferred embodiments of the present invention involve methods for forming ultra-shallow junctions in a semiconductor substrate using multiple ion implantation steps to reduce the effects of dopant channeling and diffusion. According to one preferred embodiment, an implantation process that deposits a junction narrowing species in addition to an implantation process that deposits a primary dopant allow the formation of well-defined, ultra-shallow junctions. According to another preferred embodiment, two or more implantation processes that deposit junction narrowing species in addition to the implantation process that deposits a primary dopant allow the formation of well-defined, ultra-shallow junctions. Following the implantation processes, the primary dopant is activated in a rapid thermal annealing process.

Another preferred embodiment of the present invention involves an ultra-shallow junction in a semiconductor substrate formed by one of the above-mentioned methods.

BRIEF DESCRIPTION OF THE DRAWINGS

For a more detailed description of the present invention, reference will now be made to the accompanying drawings, wherein.

DETAILED DESCRIPTION OF PREFERRED EMBODIMENTS

Figure 1:
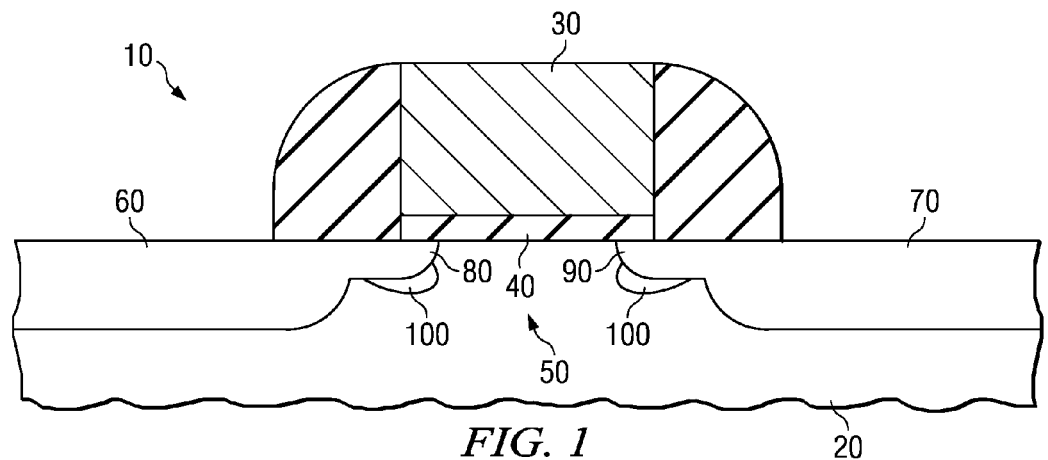
FIG. 1 depicts a cross-sectional view of a MOSFET in a semiconductor substrate.

FIG. 1 depicts a cross section of a MOSFET 10 in a semiconductor substrate 20 constructed according to a preferred embodiment of the present invention. Gate electrode 30 is disposed above gate dielectric 40, which is disposed above channel 50. Channel 50 separates drain electrode 60 and source electrode 70. Drain extension 80 and source extension 90 are partially-disposed underneath gate dielectric 40 and thereby penetrate partially into channel 50. When an appropriate voltage is applied to gate electrode 30, minority charge carriers accumulate in channel 50 and provide a conducting path between drain electrode 60 and source electrode 70. Pocket 100 is doped with an appropriate pocket species that suppresses short-channel effects by limiting the penetration of the electric fields from drain electrode 60 and source electrode 70 into channel 50.

Some of the preferred embodiments of the present invention derive from the discovery that the formation of well-defined ultra-shallow junctions in a semiconductor substrate is facilitated by the synergistic effect of one junction narrowing implantation step in addition to a primary dopant implantation step. Some of the preferred embodiments of the present invention derive from the discovery that the formation of well-defined ultra-shallow junctions in a semiconductor substrate is particularly facilitated by the synergistic effect of two or more complementary junction narrowing implantation steps in addition to a primary dopant implantation step. Thus, the preferred embodiments of the present invention employ two or more distinct implantation steps to achieve ultra-shallow junctions. As used herein, the term "ultra-shallow junction" refers to a shallow source or drain extension having a depth in the semiconductor substrate of about 1000 angstroms (Å) or less and a peak concentration of a primary dopant in the semiconductor substrate of about $5 \times 10^{18}$ atoms·cm$^{-3}$ or more. The term "junction depth" is defined herein as the depth in the semiconductor substrate at which the concentration of a primary dopant falls below about $10^{17}$ atoms·cm$^{-3}$.

As used herein, the term "primary dopant" refers to a p-type or n-type dopant or a precursor thereof whose depth profile establishes the boundaries of an ultra-shallow junction and whose concentration primarily establishes the sheet resistance of the junction. Suitable primary dopants include n-type and p-type dopants suitable for altering the electronic properties of a semiconductor. Thus, suitable primary dopants for p-type doping include members of Group III of the Periodic Table—e.g., boron, gallium and indium—and suitable primary dopants in an n-type material include members of Group V of the Periodic Table—e.g., phosphorous, arsenic andantimony. Preferably, boron or a boron precursor is a primary dopant.

For many MOSFETs, boron is the p-dopant of choice. However, as will be described below, boron has several properties that impact its use in shallow junctions. First, because of its low mass and small size, boron can channel through the silicon lattice. In addition, boron is particularly susceptible to transient enhanced diffusion (TED), which places stringent limits on the subsequent thermal processing that can be used after implant. Moreover, limitations have been reached with respect to present implant equipment capabilities and boron's light atomic weight. Even with energy reduced down to the extent of today's technology at about 5 keV, the light boron atoms can still travel further than desired, (e.g., the normal distribution of a projected range) creating a junction deeper than desired. Moreover, suitable control of an implant beam becomes increasingly difficult to achieve as implant energy levels are reduced.

The preferred embodiments of the present invention employ ion implantation as a technique for establishing a desired depth and concentration profile of appropriate chemical species—e.g., the desired dopant and junction narrowing species—in the semiconductor substrate. During an ion implantation step, an ionized precursor of a desired chemical species is formed in an ion source, accelerated to a prescribed kinetic energy, and directed at the surface of the semiconductor substrate. These energetic ions penetrate into the semiconductor substrate. Ultimately, the ions lose their kinetic energy as a result of collisions with the substrate and come to rest within the substrate. In general, the higher the kinetic energy of the ion, the further it penetrates into the substrate. In contrast, lower kinetic energy implantation generally leads to a shallower junction.

However, for several reasons, ultra-shallow junctions cannot be formed simply by lowering the kinetic energy of the precursor of the dopant species. First, lower implant energy results in decreased ion beam focus and a corresponding loss of implant control. Consequently, ion beam focus limits the minimum junction depth that can be achieved by ion implantation. Second, because the semiconductor substrate is crystalline, the dopant depth profile reflects some channeling that is dependent on the orientation of the ion beam with respect to the crystal lattice. The preferred embodiments of the present invention employ a crystalline semiconductor substrate. Because the atoms in the substrate occupy a periodic lattice, the substrate possesses crystal planes and channels. During an ion implantation step, some of the energetic ions can move along the open channels of the semiconductor substrate. Because these ions undergo fewer collisions per unit length than those ions that do not channel, ions subject to channeling penetrate further into the substrate than those that do not. Thus, channeling refers to the preferential penetration of the dopant ions along crystalline axes or planes of the substrate that results in a deep tail beyond the depth profile predicted for amorphous—i.e., noncrystalline—substrate materials. This effect is particularly pronounced for boron, whose light weight and small size result in increased channeling relative to other dopants.

Following the ion implantation steps, the preferred embodiments of the present invention employ an annealing step to incorporate the dopant into the lattice of the semiconductor substrate. Annealing, which involves heating the semiconductor substrate to a prescribed temperature for a prescribed time, activates the dopant and alters the conductivity and bulk properties of the semiconductor substrate. At the same time, the elevated temperature of the semiconductor substrate increases the diffusion rate of the dopant. The presence of oxygen and interstitial defects in the semiconductor substrate can further enhance the rate of diffusion of the dopant. These effects are referred to as oxygen enhanced diffusion (OED) and transient enhanced diffusion (TED). OED and TED can increase the diffusion rate for a dopant in the lattice by a factor of as much as 10,000.

More preferably, the preferred embodiments of the present invention utilize rapid thermal annealing (RTA) for activating the dopant implant while maintaining shallow junctions. A typical annealing profile involves a precisely controlled ramp up to a target temperature, an anneal at the target temperature for a fixed time, and a ramp down. Generally high ramp up and ramp down rates are desirable as they reduce the high temperature residence time and minimize diffusion due to TED and OED. However, although RTA can be used to minimize the diffusion that occurs during annealing, significant changes to the annealing process—e.g., reduced annealing temperatures—can reduce the amount of activated dopant material activated and adversely affect the operating characteristics of the semiconductor device. Thus, changes to the annealing profile alone cannot solve the depth profile problems associated with TED and OED.

Like channeling, diffusion effects are particularly pronounced with boron for several reasons. First, boron has a large inherent diffusivity relative to other dopants. In addition, boron is particularly susceptible to transient enhanced diffusion (TED) and oxygen enhanced diffusion (OED), both of which result in effective diffusion rates that are much higher than boron's inherent diffusivity. TED and OED result from the pairing of boron atoms with defects such as silicon interstitials—e.g., silicon atoms that have been displaced from the silicon lattice—that diffuse together at higher rates than boron alone. Because the boron-interstitial combination diffuses more quickly during the annealing period than boron alone, junction depths increase and are less well-controlled.

As used herein, the term "junction broadening" refers to an increase in the junction depth of a primary dopant. Factors that contribute to junction broadening in the semiconductor substrate include both channeling of a primary dopant during ion implantation and thermal diffusion of a primary dopant during subsequent heat treatment, such as annealing steps. OED and TED further increase the junction broadening observed from annealing. As used herein, the term "junction narrowing implantation step" refers to an implantation of a chemical species that mitigates junction broadening, irrespective of the mechanism by which this is accomplished. Thus, an implant of a species that introduces disorder into the semiconductor substrate and thereby reduces channeling is one type of junction narrowing implantation step. Similarly, an implant of a chemical species that reduces thermal diffusion of a primary dopant caused by, for example, OED or TED, is another type of junction narrowing implantation step. Junction narrowing implantation steps that function by reducing thermal diffusion can be performed either before or after an implantation of a primary dopant. However, junction narrowing implantation steps that reduce channeling of a primary dopant should occur prior to implantation of a primary dopant. A junction narrowing implantation step can function by two or more mechanisms.

As used herein, the term "junction narrowing species" refers to a chemical species useful in a junction narrowing implantation step. A wide variety of chemical and atomic species may be employed as junction narrowing species in a junction narrowing implantation step. Preferably, the junction narrowing species is selected from the group of ionized chemical species comprising antimony, germanium, silicon, carbon, fluorine, chlorine, bromine, iodine and combinations thereof. Therefore, without limiting the scope of the invention, representative examples include $F^+$, $Sb^+$, $SiCl_3^+$, and $Br^+$.

As used herein, the term "pocket implantation step" refers to an implantation step that deposits a pocket species in the spatial region just outside an ultra-shallow drain or source extension. Generally, when the dopant used inside an ultra-shallow drain or source extension is a p-type dopant, the pocket species is an n-type dopant. Conversely, when the dopant used inside an ultra-shallow drain or source extension is an n-type dopant, the pocket species is an p-type dopant. Preferably, boron is used as dopant inside the ultra-shallow drain or source extensions. Therefore, preferably the pocket species is an n-type dopant. More preferably, the pocket species is phosphorous.

The term "sheet resistance" as used herein refers to the resistance of a sheet of a material to electron flow. In general, the more thick the sheet of material, the lower the sheet resistance. Similarly, in general, the higher the dopant concentration, the lower the sheet resistance. Preferably, the sheet resistance of the ultra-shallow junctions of the preferred embodiment of the present invention are less than 1000 $\Omega/\blacksquare$. More preferably, the sheet resistance of the ultra-shallow junctions of the preferred embodiment of the present invention are less than 700 $\Omega/\blacksquare$.

The implantation of a primary dopant may be performed at any kinetic energy, (global) dose and tilt and twist angle appropriate for the desired depth profile. Preferably, the kinetic energy of a primary dopant is tailored to establish an average implant depth of less than 1000 Å, more preferably less than 300 Å. In the case of a primary dopant comprising B or $BF_2$, the kinetic energy of the implant is preferably about 5 keV or less. The implanted dopant concentration for a given depth profile is a function of the implant dose. Preferably, the dose is between about $1\times10^{14}$ cm$^{-2}$ and about $1\times10^{16}$ cm$^{-2}$. More preferably, the dose is between about $2\times10^{14}$ cm$^{-2}$ and about $6\times10^{15}$ cm$^{-2}$.

The implantation of a junction narrowing species may be performed at any kinetic energy, current dose and tilt and twist angle appropriate for the desired depth profile and effect. Preferably, the kinetic energy of a junction narrowing species used in a junction narrowing implant is tailored to establish a desired implant depth. Preferably, the kinetic energy of the junction narrowing species is between about 1 and about 30 keV. The implanted junction narrowing species concentration for a given depth profile is a function of the junction narrowing implant current dose. Preferably, the dose is between about $5\times10^{12}$ cm$^{-2}$ and about $5\times10^{15}$ cm$^{-2}$. More preferably, the dose is between about $1\times10^{13}$ cm$^{-2}$ and about $1\times10^{15}$ cm$^{-2}$.

Following the ion implantation steps, the preferred embodiments of the present invention employ a thermal processing step that activates an implanted dopant while minimizing junction spreading due to dopant diffusion. Preferably, the thermal processing step is a rapid thermal annealing (RTA) step that optimizes dopant activation as a function of thermal budget. Preferably, the RTA step reaches a maximum temperature between about 850° C. and about 1150° C. More preferably, the RTA step reaches a target temperature between about 950° C. and about 1050° C. Preferably, the soak time at the target temperature of the RTA step is between about 20 seconds and about 60 seconds. Alternatively, the RTA step can be a spike anneal wherein there is little or no dwell time at the target temperature.

Figure 2:
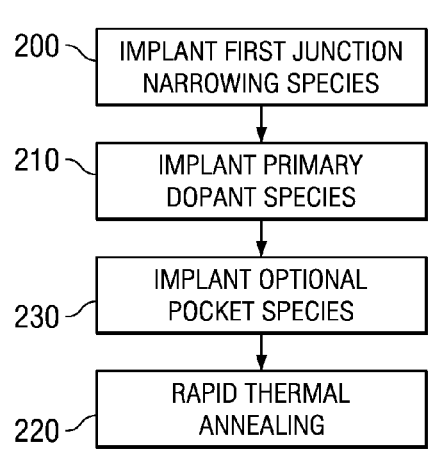
FIG. 2 is a flow diagram for a process for forming an ultra-shallow junction in a semiconductor substrate according to a preferred embodiment of the present invention.

According to one preferred embodiment, the formation of an ultra-shallow junction comprises one junction narrowing implant followed by a primary dopant implant followed by an RTA process. A flow diagram for this preferred embodiment is depicted in FIG. 2. A junction narrowing implant step 200 is performed at an appropriate energy and dose. Subsequently, a primary dopant implant step 210 is performed at an appropriate energy and dose for a desired depth profile. Finally, an RTA step 220 activates the primary dopant. Additional steps such as a pocket implantation step 230 may also be added.

Figure 3:
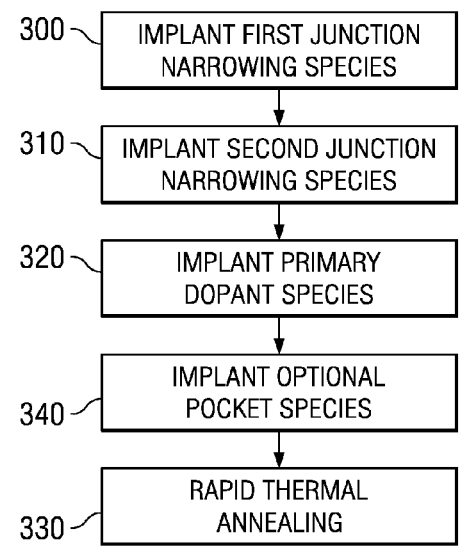
FIG. 3 is a flow diagram for a process for forming an ultra-shallow junction in a semiconductor substrate according to a preferred embodiment of the present invention.

According to one preferred embodiment, the formation of an ultra-shallow junction comprises two junction narrowing implants followed by a primary dopant implant followed by an RTA process. A flow diagram for this preferred embodiment is depicted in FIG. 3. A junction narrowing implant step 300 is performed at an appropriate energy and dose. Subsequently, another junction narrowing implant step 310 is performed at an appropriate energy and dose. Subsequently, a primary dopant implant step 320 is performed at an appropriate energy and dose for a desired depth profile. Finally, an RTA step 330 activates the primary dopant. Additional steps such as a pocket implantation step 340 may also be added.

Figure 4:
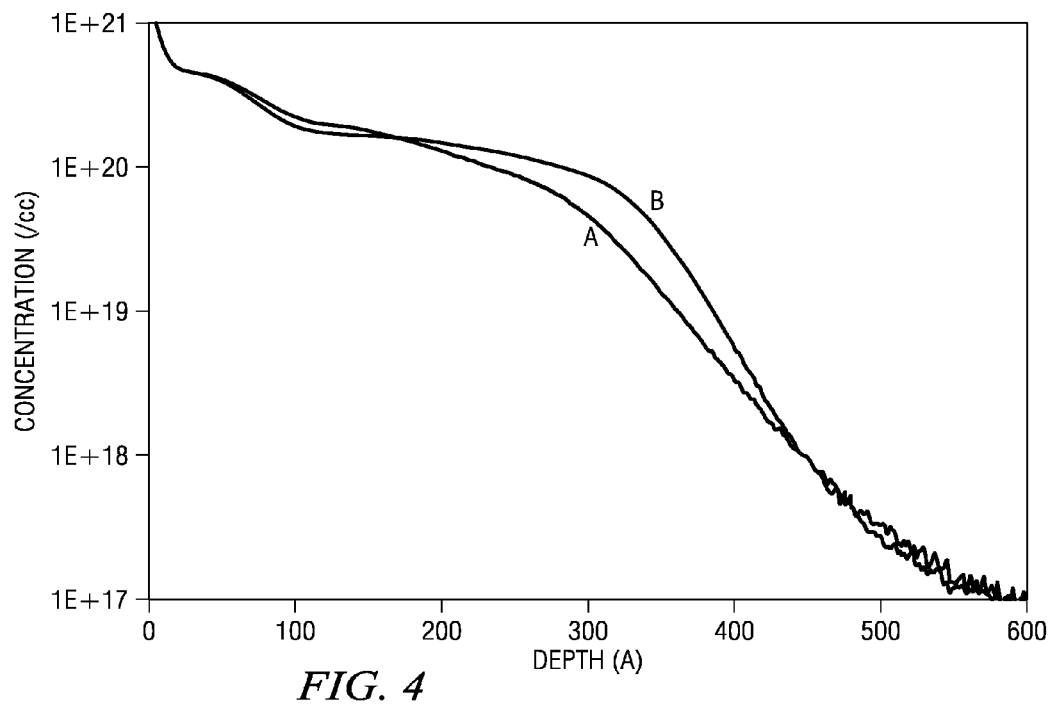
FIG. 4 is a graph contrasting the boron concentration as a function of depth in the semiconductor substrate for (a) a $Sb^+/BF_2^+/P^+$ implant and (b) a $Sb^+/F^+/BF_2^+/P^+$ implant. The antimony (Sb) implant employed a kinetic energy of 30 keV, a dose of $2\times10^{13}$ cm$^{-2}$, and a zero degree tilt angle. The fluorine (F) implant employed a kinetic energy of 30 keV, a dose of $1\times10^{15}$ cm$^{-2}$, and a zero degree tilt angle. The $BF_2^+$ implant employed a kinetic energy of 6 keV, a dose of $1\times10^{15}$ cm$^{-2}$, and a zero degree tilt angle. The phosphorous ($P^+$) implant employed a kinetic energy of 40 keV, a dose of $9\times10^{13}$ cm$^{-2}$, and a fifteen degree tilt angle.

FIG. 4 is a graph contrasting the boron concentration as a function of depth for two implantation examples. In the first example, three distinct implantation steps were performed using antimony, then boron difluoride and then phosphorous. The antimony ($Sb^+$) implant employed a kinetic energy of 30 keV, a dose of $2\times10^{13}$ cm$^{-2}$, and a zero degree tilt angle. The boron difluoride ($BF_2^+$) implant employed a kinetic energy of 6 keV, a dose of $1\times10^{15}$ $cm^{-2}$, and a zero degree tilt angle. The phosphorous ($P^+$) implant employed a kinetic energy of 40 keV, a dose of $9\times10^{13}$ $cm^{-2}$, and a fifteen degree tilt angle. The second example was performed similarly except that an additional fluorine implant was performed following the antimony implant but prior to the boron difluoride implant. The fluorine ($F^+$) implant in the second example employed a kinetic energy of 30 keV, a dose of $1\times10^{15}$ $cm^{-2}$, and a zero degree tilt angle.

Well-defined junctions result when the dopant concentration in the source and/or drain extension undergoes a steep drop as a function of depth in the semiconductor substrate. As can be seen from FIG. 4, the second example employing both the antimony and the fluorine implant prior to the boron difluoride implant resulted in a faster drop-off in boron concentration as a function of depth in the semiconductor substrate. This indicates a sharper junction between the ultra-shallow drain or source extension and the channel in the second example. In addition, as can be seen in FIG. 4, the boron concentration drops below $10^{17}$ $cm^{-3}$ at a lower substrate depth, indicating that the junction is shallower in the second example. Thus, the combined effect of two junction narrowing implantation steps—i.e., an antimony implant and a fluorine implant—offers benefits beyond those achieved with a single junction narrowing implantation step.

Figure 5:
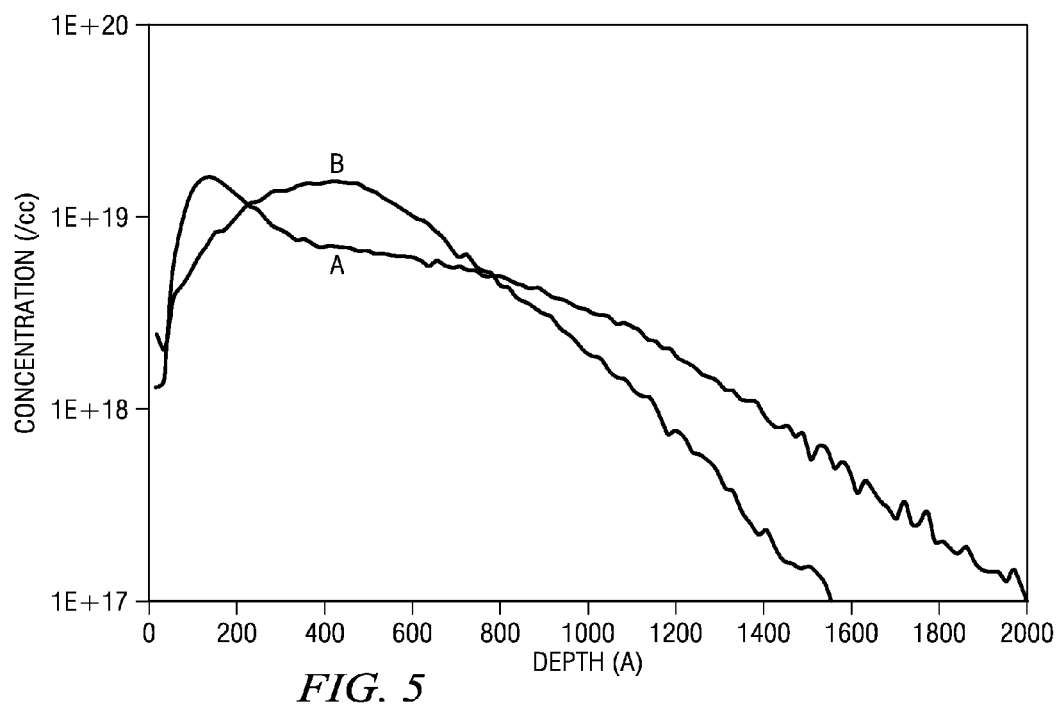
FIG. 5 is a graph contrasting the phosphorous concentration as a function of depth for (a) a $Sb^+/BF_2^+/P^+$ implant and (b) a $Sb^+/F^+/BF_2^+/P^+$ implant. The implantation conditions are those described in FIG. 4.

In addition, the two junction narrowing implantation steps in the second example offer benefits in the pocket profile. FIG. 5 is graph contrasting the phosphorous concentration as a function of depth in the semiconductor substrate for the same two implantation examples in FIG. 4. Ideally, the pocket profile should lie just outside the ultra-shallow drain and/or source extensions and not penetrate too far into the channel. As can be seen from FIG. 4, the second example employing the two junction narrowing implantation steps achieves this result. In the second example, the maximum phosphorous concentration is achieved at a substrate depth corresponding to the depth of the junction. In addition, the phosphorous concentration drops off more rapidly as a function of substrate depth in the second example, thus indicating that the pocket profile in the first example penetrates further into the channel than in the second example.

Although the two junction narrowing implantation steps in the second example were performed prior to the primary dopant implantation step, the exact mechanism whereby the improved results were achieved is unclear. It is possible that the same or better results could have been achieved if one or both of the junction narrowing implantation steps were performed after the primary dopant implantation step. Consequently, the preferred embodiments of the present invention should not be construed to limit the chronological order of the junction narrowing implantation steps with respect to a primary dopant implantation step. According to another preferred embodiment of the present invention, the formation of an ultra-shallow junction comprises a first junction narrowing implant followed by a primary dopant implant followed by a second junction narrowing implant followed by an RTA process. Preferably the junction narrowing species in the first junction narrowing implant comprises antimony, germanium and/or silicon and the junction narrowing species in the second junction narrowing implant comprises carbon, fluorine, chlorine, bromine and/or iodine. According to yet another preferred embodiment of the present invention, the formation of an ultra-shallow junction comprises a primary dopant implant followed by a first junction narrowing implant followed by a second junction narrowing implant followed by an RTA process. Additional implantation steps—e.g., pocket implantation steps or additional junction narrowing implantation steps—may also be employed.

While the preferred embodiments of the present invention have been shown and described, modifications thereof can be made by one skilled in the art without departing from the spirit and teachings of the invention. In particular, because many junction narrowing implantation steps can be performed either before or after a primary dopant implantation step or a different junction narrowing implantation step, the recitation of methods having multiple implantation steps does not limit the order of the steps. The embodiments described herein are exemplary only, and are not intended to be limiting. Many variations and modifications of the invention disclosed herein are possible and are within the scope of the invention.

Accordingly, the scope of protection is not limited by the description set out above, but is only limited by the claims which follow, that scope including all equivalents of the subject matter of the claims. Each and every claim is incorporated into the specification as an embodiment of the present invention. Thus the claims are a further description and are an addition to the preferred embodiments of the present invention. Use of the term "optional" with respect to any element of a claim is intended to mean that the subject element is required, or alternatively, is not required. Both alternatives are intended to be within the scope of the claim. The discussion of a reference in the Description of Related Art is not an admission that it is prior art to the present invention, especially any reference that may have a publication date after the priority date of this application. The disclosures of all patents, patent applications and publications cited herein are hereby incorporated herein by reference, to the extent that they provide exemplary, procedural or other details supplementary to those set forth herein.

What is claimed is:

1. An ultra-shallow junction in a semiconductor substrate having a top surface, comprising:
   a. a junction near the top surface, having substantially flat portion substantially parallel the top surface;
   b. a region between the flat portion and the top surface, containing boron atoms, antimony atoms and fluorine atoms; and
   c. the fluorine atoms in the region being more than two times the boron atoms in the region.

2. The ultra-shallow junction in claim 1, in which the density of the boron atoms at the vicinity of the junction is about $1\times10^{18}$ atoms/$cm^3$.

3. The ultra-shallow junction in claim 2, in which the substantially portion is about 35 nm to 50 nm from the top surface.

4. The ultra-shallow junction in claim 2, in which the substantially portion is about 28 nm to 38 nm from the top surface.

* * * * *